United States Patent
Suzuka et al.

(10) Patent No.: US 11,081,291 B2
(45) Date of Patent: Aug. 3, 2021

(54) PHOTOSENSOR INCLUDING PHOTOELECTRIC CONVERSION LAYER CONTAINING PEROVSKITE COMPOUND, AND OPTICAL DETECTION DEVICE INCLUDING THE SAME

(71) Applicant: Panasonic Intellectual Property Management Co., Ltd., Osaka (JP)

(72) Inventors: Michio Suzuka, Kyoto (JP); Ryuusuke Uchida, Osaka (JP); Taisuke Matsui, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 65 days.

(21) Appl. No.: 16/035,593

(22) Filed: Jul. 14, 2018

(65) Prior Publication Data
US 2019/0027316 A1 Jan. 24, 2019

(30) Foreign Application Priority Data

Jul. 20, 2017 (JP) .............................. JP2017-140980
Nov. 29, 2017 (JP) .............................. JP2017-228938

(51) Int. Cl.
*H01L 51/42* (2006.01)
*H01G 9/20* (2006.01)
(Continued)

(52) U.S. Cl.
CPC ......... *H01G 9/2009* (2013.01); *H01G 9/0036* (2013.01); *H01L 27/305* (2013.01);
(Continued)

(58) Field of Classification Search
CPC ... H01L 51/4206; H01L 27/30; H01L 27/301; H01L 27/305; H01L 27/307;
(Continued)

(56) References Cited

U.S. PATENT DOCUMENTS 6,307,196 B1 * 10/2001 Thompson ................ G01J 1/44
250/214 A
2012/0049044 A1 3/2012 Kuboi
(Continued)

FOREIGN PATENT DOCUMENTS

| JP | 1-077182 | 3/1989 |
|----|----------|--------|
| JP | 2006-066535 | 3/2006 |

(Continued)

OTHER PUBLICATIONS

Qianqian Lin et al., "Low Noise, IR-Blind Organohalide Perovskite Photodiodes for Visible Light Detection and Imaging", Advanced Materials, 27, Feb. 11, 2015, pp. 2060-2064.
(Continued)

*Primary Examiner* — Monica D Harrison
*Assistant Examiner* — John Lin
(74) *Attorney, Agent, or Firm* — Renner, Otto, Boisselle & Sklar, LLP

(57) ABSTRACT

A photosensor includes a first electrode, a second electrode that opposes the first electrode, and a photoelectric conversion layer that is disposed between the first electrode and the second electrode and converts incident light into electric charges. At least one electrode selected from the group consisting of the first electrode and the second electrode is light-transmissive. The photoelectric conversion layer contains a perovskite compound. The fluorescence spectrum of the perovskite compound has a first peak at a first wavelength and a second peak at a second wavelength that is longer than the first wavelength. The photoelectric conversion layer is in ohmic contact with each of the first electrode and the second electrode.

14 Claims, 19 Drawing Sheets

(51) Int. Cl.
    *H01L 27/30*  (2006.01)
    *H01G 9/00*  (2006.01)
    *H01L 51/00*  (2006.01)
    *H01L 51/44*  (2006.01)

(52) U.S. Cl.
    CPC ...... *H01L 51/0007* (2013.01); *H01L 51/0028* (2013.01); *H01L 51/4206* (2013.01); *H01L 51/4253* (2013.01); *H01L 51/442* (2013.01); *H01L 51/0077* (2013.01)

(58) Field of Classification Search
    CPC .............. H01L 51/4253; H01L 51/007; H01L 51/0028; H01L 51/0077; H01L 51/442; H01G 9/2009; H01G 9/006
    See application file for complete search history.

(56) References Cited

U.S. PATENT DOCUMENTS

| | | |
|---|---|---|
| 2013/0015435 A1 | 1/2013 | Sawaki et al. |
| 2015/0136232 A1 | 5/2015 | Snaith et al. |
| 2016/0127668 A1 | 5/2016 | Fujita et al. |
| 2016/0380032 A1 | 12/2016 | Park et al. |
| 2018/0075979 A1* | 3/2018 | Jung ................... H01L 51/0037 |
| 2018/0201637 A1* | 7/2018 | Sampson .............. C07F 15/065 |

FOREIGN PATENT DOCUMENTS

| | | |
|---|---|---|
| JP | 2011-222949 | 11/2011 |
| JP | 2012-049289 | 3/2012 |
| JP | 2014-241489 | 12/2014 |
| JP | 2015-517736 | 6/2015 |
| JP | 2017-011273 | 1/2017 |
| JP | 2017-028114 | 2/2017 |

OTHER PUBLICATIONS

Sekimoto et al.; Inverse Temperature Crystallization of Formamidinium Tin Iodide: Indirect Transition State and Restriction of Cation Motion; Crystal Growth & Design; 2020, 20, pp. 874-883.

Sampson et al., Transition metal-substituted lead halide perovskite absorbers, Journal of Materials Chemistry A, Jan. 27, 2017, pp. 3578-3588.

* cited by examiner

PHOTOSENSOR INCLUDING PHOTOELECTRIC CONVERSION LAYER CONTAINING PEROVSKITE COMPOUND, AND OPTICAL DETECTION DEVICE INCLUDING THE SAME

BACKGROUND

1. Technical Field

The present disclosure relates to a photosensor and an optical detection device including the same.

2. Description of the Related Art

In recent years, there has been an increasing demand for photosensors. A photosensor includes elements used in, for example, image sensors or photodetectors which sense the intensity and wavelength of incident light. In particular, a photosensor capable of detecting visible light (400 to 800 nm) and near-infrared light (800 to 1200 nm) needs a large number of pixels, high-speed imaging, and a narrow band of wavelengths to be sensed. A narrow band of wavelengths to be sensed is intended to allow the photosensor to detect only particular wavelengths with the photosensor.

Perovskite solar cells have been under research and development. A perovskite solar cell includes, as a light-absorbing material, a perovskite crystal represented by composition formula $AMX_3$ (A is a monovalent cation, M is a divalent cation, and X is a halogen anion) or its analogous structure). The light-absorbing material can be used in a photosensor. For example, Adv. Mater. 2015, 27, 2060-2064 discloses a sensor including a perovskite layer containing $CH_3NH_3PbI_3$ (hereinafter may be abbreviated as "$MAPbI_3$") as a light-absorbing material.

SUMMARY

One non-limiting and exemplary embodiment provides a photosensor including a first electrode; a second electrode that opposes the first electrode; and a photoelectric conversion layer that is disposed between the first electrode and the second electrode and converts incident light into electric charges. At least one electrode selected from the group consisting of the first electrode and the second electrode is light-transmissive. The photoelectric conversion layer contains a perovskite compound. The fluorescence spectrum of the perovskite compound has a first peak at a first wavelength and a second peak at a second wavelength that is longer than the first wavelength. The photoelectric conversion layer is in ohmic contact with each of the first electrode and the second electrode.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
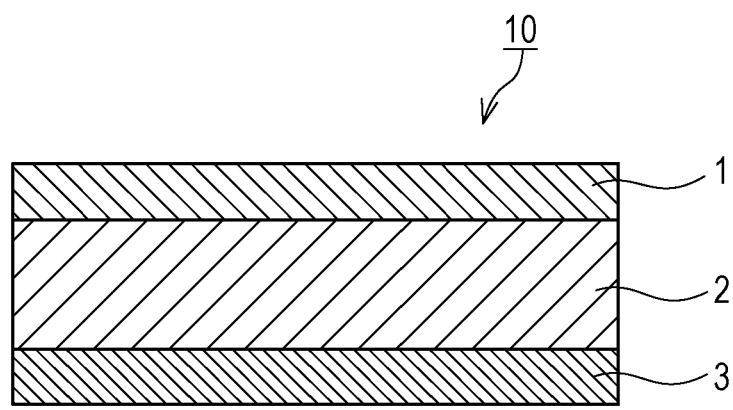
FIG. 1 is a schematic cross-sectional view of an example of a photosensor according to the present disclosure.

Underlying Knowledge Forming Basis of the Present Disclosure

A photosensor has a device structure similar to that of a solar cell and can easily detect light. Plural photosensors can densely be connected to each other. However, one element in an existing photosensor detects only light in one wavelength band. When the sensitivity to light in plural wavelength bands is needed, plural elements are disposed. For example, Japanese Unexamined Patent Application Publication No. 2017-011273 discloses a method for distinguishing and detecting light in plural wavelength bands by arranging plural elements sensitive to different wavelength bands in a plane. This method, however, needs different types of elements, which makes it difficult to increase the density of elements. Japanese Unexamined Patent Application Publication No. 1-077182 discloses a method for distinguishing and detecting light in plural wavelength bands by arranging plural elements sensitive to different wavelength bands in the thickness direction. However, stacking the elements leads to a complex device structure. To achieve a photosensor sensitive to light in plural wavelength bands, there is an issue that the density of elements cannot be increased to a certain level or higher, or the elements become more complex.

Overview of One Aspect According to the Present Disclosure

A photosensor according to a first aspect of the present disclosure includes:

a first electrode;

a second electrode that opposes the first electrode; and a photoelectric conversion layer that is disposed between the first electrode and the second electrode and converts incident light into electric charges.

At least one electrode selected from the group consisting of the first electrode and the second electrode is light-transmissive.

The photoelectric conversion layer contains a perovskite compound.

The fluorescence spectrum of the perovskite compound has a first peak at a first wavelength and a second peak at a second wavelength that is longer than the first wavelength.

The photoelectric conversion layer is in ohmic contact with each of the first electrode and the second electrode.

In the photosensor according to the first aspect, the fluorescence spectrum of the perovskite compound contained in the photoelectric conversion layer has a first peak and a second peak. In the photosensor, the photoelectric conversion layer is in ohmic contact with each of the first electrode and the second electrode. The direction of the detected current thus changes with the wavelength band of irradiation light. Therefore, one element can distinguish and detect light in plural wavelength bands.

In a second aspect of the present disclosure, for example, a difference between the value of the work function of the first electrode and the value of the work function of the second electrode in the photosensor according to the first aspect may be 0.5 eV or less. According to the second aspect, one element of the photosensor can distinguish and detect light in plural wavelength bands.

In a third aspect of the present disclosure, the perovskite compound of the photosensor according to the first or second aspect may have a first band gap corresponding to the first peak and a second band gap corresponding to the second peak. The value of the work function of the first electrode or the second electrode may be located between the conduction band bottom of the first band gap and the conduction band bottom of the second band gap or between the valence band top of the first band gap and the valence band top of the second band gap. According to the third aspect, one element of the photosensor can distinguish and detect light in plural wavelength bands. In a fourth aspect of the present disclosure, the photosensor according to any one of the first to third aspects may be such that the first peak is located in a wavelength range of 800 nm or more and 840 nm or less, and the second peak is located in a wavelength range of 850 nm or more and 910 nm or less.

An optical detection device according to a fifth aspect of the present disclosure includes:

the photosensor according to any one of the first to fourth aspects; and a detector electrically connected to the photosensor.

The optical detection device according to the fifth aspect has a small size. When plural optical detection devices are connected to one other for use, the number of optical detection devices per unit area is large.

In a sixth aspect of the present disclosure, for example, the optical detection device according to the fifth aspect may further include a diode electrically connected to the photosensor. In the optical detection device according to the fifth aspect, the on/off control of the diode can be performed in accordance with the wavelength of irradiation light.

In a seventh aspect of the present disclosure, for example, the optical detection device according to the fifth or sixth aspect may further include a charge accumulator electrically connected to the photosensor. In the optical detection device according to the seventh aspect, the charge accumulator can store charges generated in the photosensor. Even if the electromotive force generated from the photosensor is small, the current can be amplified.

In an eighth aspect of the present disclosure, for example, the charge accumulator in the optical detection device according to the seventh aspect may be configured to accumulate positive charges and negative charges. In the optical detection device according to the eighth aspect, the current can be amplified regardless of the direction of the current generated from the photosensor.

In a ninth aspect of the present disclosure, for example, the optical detection device according to any one of the fifth to eighth aspects may further include a power supply electrically connected to the photosensor. In the optical detection device according to the ninth aspect, the power supply can apply a bias voltage to the photosensor. The changeover wavelength of the photosensor can be controlled by controlling the magnitude of the bias voltage applied to the photosensor. The photosensor can thus detect light in a given wavelength band. In a tenth aspect of the present disclosure, the optical detection device according to any one of the fifth to ninth aspects may be such that the first peak is located in a wavelength range of 800 nm or more and 840 nm or less, and the second peak is located in a wavelength range of 850 nm or more and 910 nm or less.

A light-absorbing material according to an eleventh aspect of the present disclosure contains:

a perovskite compound represented by composition formula $AMX_3$, where A is a monovalent cation, M is a divalent cation, and X is a monovalent anion.

The M includes $Sn^{2+}$.

The fluorescence spectrum of the light-absorbing material has a first peak and a second peak located on the longer wavelength side than the first peak.

In the light-absorbing material according to the eleventh aspect, the fluorescence spectrum has a first peak and a second peak. When suitable electrodes are selected, the direction of the current generated from the light-absorbing material can be changed in accordance with the wavelength band of irradiation light. In other words, the light-absorbing material ensures that light in plural wavelength bands can be distinguished and detected.

In a twelfth aspect of the present disclosure, the A of the light-absorbing material according to the eleventh aspect may include a formamidinium cation. The light-absorbing material according to the twelfth aspect ensures that light in plural wavelength bands can be distinguished and detected. In a thirteenth aspect of the present disclosure, the light-absorbing material according to any one of the eleventh to twelfth aspects may be such that the first peak is located in a wavelength range of 800 nm or more and 840 nm or less, and the second peak is located in a wavelength range of 850 nm or more and 910 nm or less.

Embodiments of the Present Disclosure

Embodiments of the present disclosure will be described below with reference to the drawings. The present disclosure is not limited to the following embodiments.

First Embodiment

In a first embodiment, an embodiment of the photosensor of the present disclosure will be described. The overview of the embodiment of the photosensor of the present disclosure is as described below.

As depicted in FIG. 1, a photosensor 10 according to this embodiment includes a first electrode 1, a photoelectric conversion layer 2, and a second electrode 3. The photoelectric conversion layer 2 contains a perovskite compound. The fluorescence spectrum of the perovskite compound has a first peak and a second peak located on the longer wavelength side than the first peak. A perovskite compound having such a property may be referred to as a "perovskite compound in the first embodiment".

Material with Two or More Photoluminescence Peaks

A material with two or more PL (Photoluminescence) peaks will be described below.

A semiconductor material typically has one band gap derived from the band structure thereof and has one PL peak corresponding to the band gap. A perovskite material may have, in addition to a band gap (hereinafter referred to as a "first band gap") across which direct electron transition occurs, a band gap (hereinafter referred to as a "second band gap") across which electron transition occurs with a smaller energy. A perovskite material having a second band gap has a small absorption coefficient due to the second band gap. The fluorescence associated with the second band gap has a long fluorescence lifetime. The second band gap is said to come from spin orbit interaction, and such a perovskite material has a small band gap, which is different from a band gap near a typical band gap.

Figure 2:
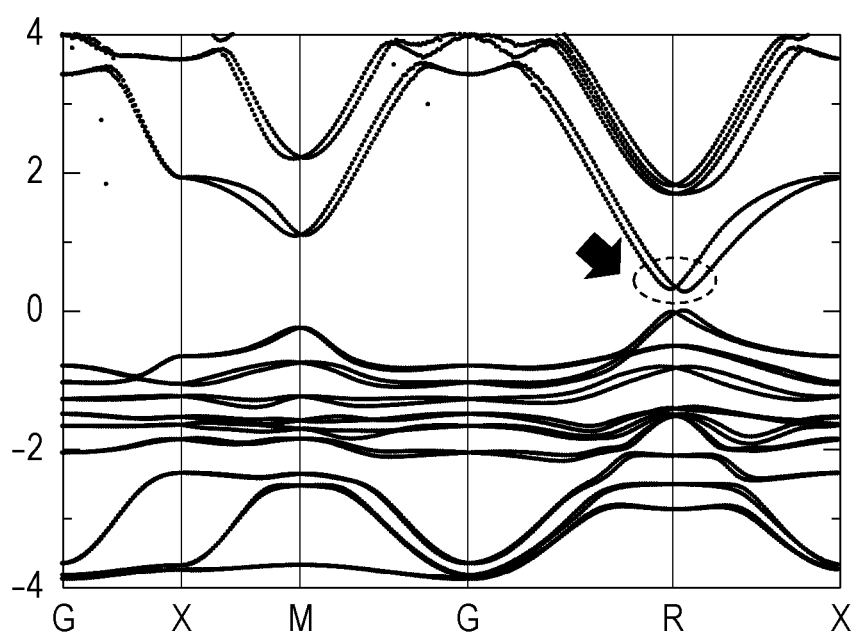
FIG. 2 is a graph of the band structure of $CH_3NH_3PbI_3$, which exhibits a fluorescence spectrum with two fluorescence peaks.

FIG. 2 depicts the band structure when spin orbit interaction is taken into consideration using first-principles calculations. As a model of the band structure, $CH_3NH_3PbI_3$ which exhibits a fluorescence spectrum having two PL peaks is used.

In FIG. 2, the bottom of the conduction band is near the arrow (in the dotted line), and conduction band splitting is observed. In other words, $CH_3NH_3PbI_3$, which is used as a model, has a first band gap and a second band gap.

Next, irradiation of a material having such a property with light will be described. Irradiation with light having an energy larger than the first band gap causes direct electron transition across the first band gap and the corresponding charge separation. In this case, there is a low probability that transition occurs across the second band gap. This is because the absorption coefficient associated with the second band gap is small and the probability of transition across the second band gap is lower than that across the first band gap. Therefore, the charge-separated electrons and holes are respectively present in the conduction band and the valence band of the first band gap at a high probability.

Irradiation with light having an energy smaller than the first band gap and larger than the second band gap causes indirect electron transition across the second band gap and the corresponding charge separation. The charge-separated electrons and holes are respectively present in the conduction band and the valence band of the second band gap. The conduction band of the second band gap is at a lower energy level than the conduction band of the first band gap. The valence band of the second band gap is at a higher energy level than the valence band of the first band gap.

Since the spin orientation differs between these two transitions, mutual transition does not easily occur. For example, an electron that has made direct transition across the first band gap is not easily transferred to the conduction band of the second band gap. In other words, an electron that has made direct transition across the first band gap is not easily transferred to the conduction band of the second band gap even if the electron is deactivated in a thermal process. The recombination of an electron and a hole that are charge-separated across the first band gap causes fluorescence. Due to this fluorescence, the fluorescence spectrum has a first peak. The recombination of an electron and a hole that are charge-separated across the second band gap causes fluorescence. Due to this fluorescence, the fluorescence spectrum has a second peak located on the longer wavelength side than the first peak.

The electron and hole energy levels associated with the transition in the light-absorbing material thus differ in accordance with the wavelength band of irradiation light. For this, it is possible to control the currents generated by these two transitions so as to flow in the opposite directions by sandwiching the light-absorbing material between suitable electrodes.

Perovskite Compound

Next, the perovskite compound in the first embodiment will be described. The perovskite compound in the first embodiment is represented by composition formula $AMX_3$ (A is a monovalent cation, M is a divalent cation, and X is a monovalent anion) and has a perovskite structure. The A includes, for example, a formamidinium cation. The M includes, for example, at least one selected from the group consisting of $Pb^{2+}$ and $Sn^{2+}$. The M includes, for example, $Sn^{2+}$. The composition formula $AMX_3$ is, for example, $HC(NH_2)_2PbI_3$ (hereinafter may be abbreviated as "$FAPbI_3$"), $HC(NH_2)_2SnI_3$ (hereinafter may be abbreviated as "$FASnI_3$"), $CH_3NH_3PbI_3$ (hereinafter may be abbreviated as "$MAPbI_3$"), or $CH_3NH_3SnI_3$ (hereinafter may be abbreviated as "$MASnI_3$").

As described above, the fluorescence spectrum of the perovskite compound in the first embodiment has a first peak and a second peak located on the longer wavelength side than the first peak. The first peak is located, for example, in the range from 800 to 840 nm. The second peak is located, for example, between the first peak and a wavelength having an lower energy than the wavelength of the first peak by 0.05 eV. The second peak is located, for example, in the range from 850 and 910 nm. The fluorescence lifetime of the fluorescence of the second peak is longer than the fluorescence lifetime of the fluorescence of the first peak. In the measurement of the fluorescence lifetime at the fluorescence peak, the fluorescence lifetime of the fluorescence of the second peak is, for example, in the range from 10 to 30 nanoseconds at 25° C. The fluorescence lifetime of the fluorescence of the first peak is, for example, 5 nanoseconds or more and less than 10 nanoseconds under the same conditions. The fluorescence spectrum of the perovskite compound can be measured with a commercially available spectrophotofluorometer. The fluorescence lifetime can be measured with a commercially available fluorescence lifetime spectrometer.

Method for Producing Perovskite Compound

Next, an example method for producing the perovskite compound in the first embodiment will be described.

First, $MX_2$ and AX are added to an organic solvent. The concentration of $MX_2$ in the organic solvent may be the same as that of AX. The organic solvent is, for example, γ-butyllactone. Next, the organic solvent is heated, and $MX_2$ and AX are dissolved in the organic solvent to produce a first solution. The first solution thus produced is stored at room temperature.

Next, the first solution that has been cooled to room temperature is mixed with water to produce a second solution. The volume ratio of water in the second solution is, for example, 0.7 vol %. The second solution thus produced is stored at room temperature. The time for which the second solution is stored (storage time Ts) is, for example, 0 to 48 hours.

Next, the second solution is subjected to a heat treatment. In the heat treatment, the temperature of the second solution is gradually increased from a first temperature to a second temperature. The first temperature is lower than the second temperature. The first temperature is in the range from, for example, −20° C. to 80° C. The second temperature is in the range from, for example, 70° C. to 200° C. The time that it takes to reach the second temperature from the first temperature is, for example, from 0.5 hours to 10 hours. The heat treatment under these conditions causes the crystal of the perovskite compound to be slowly deposited from the second solution.

Such slow crystal deposition results in deposition of a material having two PL peaks. This may be because a slow rate of crystal deposition provides a material with high crystallinity. The inventors of the present disclosure think that the conduction band splitting as described above mainly results from uniform orientation of organic molecules at A sites in the perovskite structure. In other words, the $MX_6$ octahedron is more distorted as more organic molecules at A sites are oriented in the same direction. As a result, the perovskite crystal has no space-reflection symmetry, which causes splitting of the degenerate conduction band. This may be the reason that the second PL peak appears. The production of the crystal by the above-described method that offers high crystallinity tends to make the orientation of the organic molecules uniform and provides a material having two PL peaks.

The method for producing the perovskite compound in the first embodiment is not limited to the above-described method. For example, the perovskite compound in the first embodiment may be produced by an inverse temperature crystallization (ITC) method. In the ITC method, the first solution is prepared first. Next, the first solution is applied to a substrate by spin coating, followed by heating. This process provides a sample in which a template layer is formed on the substrate.

Next, the first solution and the sample are heated. The sample is immersed in the heated first solution. Next, the sample is taken out of the first solution, and the solvent on the sample surface is removed. Next, the sample is subjected to a heat treatment. The heat treatment is carried out, for example, at 100° C. for 5 min to 15 min and then at 180° C. for 5 min to 15 min. This provides the perovskite compound in the first embodiment.

Structure of Photosensor 10

Next, the structure of a photosensor 10 will be described.

As depicted in FIG. 1, a first electrode 1, a photoelectric conversion layer 2, and a second electrode 3 are stacked in this order in the thickness direction of the photosensor 10. The first electrode 1 opposes the second electrode 3 across the photoelectric conversion layer 2. The photoelectric conversion layer 2 is disposed between the first electrode 1 and the second electrode 3. The photosensor 10 may further include a substrate that supports the first electrode 1, the photoelectric conversion layer 2, and the second electrode 3.

In this case, the first electrode 1, the photoelectric conversion layer 2, and the second electrode 3 may be stacked on the substrate in this order. At least one electrode selected from the group consisting of the first electrode 1 and the second electrode 3 is light-transmissive. As used herein, the term "electrode is light-transmissive" means that the electrode transmits 10% or more of light having a given wavelength selected from light having wavelengths of 200 to 2000 nm.

The first electrode 1 and the second electrode 3 are each formed of a material that comes in ohmic contact with the photoelectric conversion layer 2. The first electrode 1 and the second electrode 3 formed of such a material allow a current to flow in a second direction from the photoelectric conversion layer 2. Therefore, the effect that the direction of flowing current changes in response to a change in the wavelength band of irradiation light can be obtained.

A difference between the value of the work function of the first electrode 1 and the value of the work function of the second electrode 3 is, for example, 0.5 eV or less. When a difference between the value of the work function of the first electrode 1 and the value of the work function of the second electrode 3 is set in this range, an electron that has made transition across the first band gap and an electron that has made transition across the second band gap move to different electrodes at a high probability. In other words, the direction of the current is easily changed by changing the wavelength band of irradiation light. A difference between the value of the work function of the first electrode 1 and the value of the work function of the second electrode 3 may be 0.1 eV or less.

The value of the work function of one of the first electrode 1 and the second electrode 3 may be located between the conduction band bottom of the first band gap and the conduction band bottom of the second band gap or between the valence band top of the first band gap and the valence band top of the second band gap. In other words, the value of the work function of at least one electrode selected from the group consisting of the first electrode 1 and the second electrode 3 may be a value between the energy level of the conduction band bottom of the first band gap and the energy level of the conduction band bottom of the second band gap or may be a value between the energy level of the valence band top of the first band gap and the energy level of the valence band top of the second band gap. When the values of the work functions of the first electrode 1 and the second electrode 3 are each a value between the energy level of the conduction band bottom and the energy level of the valence band top of the second band gap, the direction of flowing current does not change even if the wavelength band of irradiation light is changed. When the value of the work function of one of the first electrode 1 and the second electrode 3 is located between the conduction band bottom of the first band gap and the conduction band bottom of the second band gap or between the valence band top of the first band gap and the valence band top of the second band gap, the direction of flowing current can easily change in response to a change in the wavelength band of irradiation light.

The photosensor 10 in this embodiment can be produced by, for example, the following method. First, the first electrode 1 is formed on the surface of the substrate by, for example, a chemical vapor deposition (CVD) method or a sputtering method. Next, the photoelectric conversion layer 2 is formed on the first electrode 1 by, for example, a coating method. For example, the photoelectric conversion layer 2 obtained by cutting the perovskite compound to a predetermined thickness may be disposed on the first electrode 1. The second electrode 3 can be then formed on the photoelectric conversion layer 2 to provide the photosensor 10.

Next, the basic operational effect of the photosensor 10 will be described. Upon irradiation of the photosensor 10 with light, the photoelectric conversion layer 2 absorbs light and generates an excited electron and a hole. In charge separation of electrons and holes across the first band gap, the excited electron moves to, for example, the first electrode 1. At this time, the hole generated in the photoelectric conversion layer 2 moves to the second electrode 3. The current flowing in the first direction from the first electrode 1 and the second electrode 3 can thus be obtained in the photosensor 10. In charge separation of electrons and holes across the second band gap, the excited electron moves to, for example, the second electrode 3. At this time, the hole generated in the photoelectric conversion layer 2 moves to the first electrode 1. The current flowing in the second direction from the first electrode 1 and the second electrode 3 can thus be obtained in the photosensor 10. The second direction is a direction opposite to the first direction. In the photosensor 10, the direction of the detected current thus changes with the wavelength band of irradiation light. Therefore, one element of the photosensor can distinguish and detect light in plural wavelength bands.

For the photosensor 10, the direction of the current generated upon irradiation of the photosensor 10 with light having a wavelength shorter than a particular wavelength may be different from the direction of the current generated uopn irradiation of the photosensor 10 with light having a wavelength longer than a particular wavelength. In other words, when the wavelength of light with which the photosensor 10 is irradiated is changed stepwisely, the direction of the current generated from the photosensor 10 may change at a particular wavelength. In this specification, the particular wavelength may be expressed as a "changeover wavelength."

The changeover wavelength is set in accordance with, for example, the material of the first electrode 1, the material of the photoelectric conversion layer 2, and the material of the second electrode 3. When a bias voltage is applied to the photosensor 10, the changeover wavelength changes with the magnitude of the bias voltage. The reason for this will be described below.

The perovskite compound in the photoelectric conversion layer 2 of the photosensor 10 has a first band gap and a second band gap. In this case, the photosensor 10 is regarded equivalent to a combination of a first solar cell that provides negative electricity generation and a second solar cell that provides positive electricity generation. For example, the quantum efficiency of the photosensor 10 to which no bias voltage is applied is a negative value for wavelengths of less than A nm and a positive value for wavelengths of A nm or more and B nm or less (A<B). In the wavelength band of less than A nm, the absolute value of the amount of electricity generated by the first solar cell is regarded larger than the absolute value of the amount of electricity generated by the second solar cell. In the wavelength band of A nm or more and B nm or less, the absolute value of the amount of electricity generated by the second solar cell is regarded larger than the absolute value of the amount of electricity generated by the first solar cell. The changeover wavelength of the photosensor 10 in this case is A nm. The changeover wavelength of the photosensor 10 corresponds to the wavelength at which the absolute value of the amount of electricity generated by the first solar cell is equal to the absolute value of the amount of electricity generated by the second solar cell. The application of a negative bias voltage to the photosensor 10 makes it difficult to obtain the output from the first solar cell and makes it easy to obtain the output from the second solar cell. Therefore, the changeover wavelength shifts to the shorter wavelength side than A nm. The application of a positive bias voltage to the photosensor 10 causes a phenomenon opposite to that in the application of a negative bias voltage to the photosensor 10. The changeover wavelength also continuously changes in response to a continuous change in the magnitude of the bias voltage applied to the photosensor 10. For this, the photosensor 10 having a certain changeover wavelength is produced by controlling the magnitude of the bias voltage applied to the photosensor 10. The photosensor 10 can thus detect light in a given wavelength band.

The components of the photosensor 10 will be described below in detail.

Substrate

The substrate is a subordinate component. The substrate plays a role in holding each layer of the photosensor 10. The substrate can be formed from a transparent material. The substrate may be, for example, a glass substrate or a plastic substrate. Examples of the plastic substrate include a plastic film. Since the first electrode 1 when having sufficient strength can hold each layer, the substrate is not necessarily provided.

First Electrode 1

The first electrode 1 is conductive. The first electrode 1 comes into ohmic contact with the photoelectric conversion layer 2. The first electrode 1 is light-transmissive. The first electrode 1 transmits, for example, light in the visible region to the near-infrared region. The first electrode 1 can be formed of a transparent conductive metal oxide, that is, a degenerate semiconductor doped with a sufficient amount of a carrier. Examples of such a metal oxide include an indium-tin complex oxide, an antimony-doped tin oxide, a fluorine-doped tin oxide, a zinc oxide doped with at least one of boron, aluminum, gallium, and indium, and composites thereof. The first electrode 1 may be formed by stacking plural metal or semiconductor layers.

The first electrode 1 may be formed of a non-transparent material so as to have a pattern through which light passes. Examples of the pattern through which light passes include linear (stripe) patterns, wavy patterns, lattice (mesh) patterns, punched metal patterns in which plural fine through-holes are arranged regularly or irregularly, and positive/negative reversal patterns thereof. When the first electrode 1 has such a pattern, light can pass through openings at which the electrode material is absent. Examples of a non-transparent electrode material include platinum, gold, silver, copper, aluminum, rhodium, indium, titanium, iron, nickel, tin, zinc, and alloys containing any one of the foregoing. The electrode material may be a conductive carbon material.

The light transmittance of the first electrode 1 may be, for example, 50% or more or may be 80% or more. The wavelength of light that the first electrode 1 transmits depends on the absorption wavelength of the photoelectric conversion layer 2. The thickness of the first electrode 1 is, for example, in the range of 1 nm or more and 1000 nm or less.

Photoelectric Conversion Layer 2

The photoelectric conversion layer 2 contains the perovskite compound in the first embodiment. The photoelectric conversion layer 2 has a thickness of, for example, 100 nm or more and 300 μm or less. When the thickness of the photoelectric conversion layer 2 is set in this range, a sufficient amount of light absorption is ensured, and electrons and holes can be dispersed well in the layer. Therefore, the electrons and holes can easily move to the first electrode 1 and the second electrode 3. The photoelectric conversion layer 2 may be formed by cutting the perovskite compound out as described above.

The photoelectric conversion layer 2 may contain a light-absorbing material in addition to the perovskite compound in the first embodiment. The photoelectric conversion layer 2 may contain a light-absorbing material containing the perovskite compound in the first embodiment. The light-absorbing material may mainly contain the perovskite compound in the first embodiment. The expression "the light-absorbing material mainly contains the perovskite compound in the first embodiment" means that the light-absorbing material contains 90 mass % or more of the perovskite compound in the first embodiment and may contain, for example, 95 mass % or more of the perovskite compound in the first embodiment or may consist of the perovskite compound in the first embodiment.

The light-absorbing material contains the perovskite compound in the first embodiment and may contain an impurity. The light-absorbing material may further contain other compounds different from the perovskite compound in the first embodiment.

Second Electrode 3

The second electrode 3 is conductive. The second electrode 3 comes into ohmic contact with the photoelectric conversion layer 2. The second electrode 3 may be light-transmissive. The second electrode 3 can be formed of the same material as the first electrode 1. The second electrode 3 may be formed by stacking plural metal or semiconductor layers.

Second Embodiment

In a second embodiment, an optical detection device of the present disclosure will be described.

The photosensor 10 may be electrically connected to a detector for detecting current generated in the photosensor 10. The photosensor 10 may be electrically connected to a diode that conducts only current in either the positive or negative direction. The photosensor 10 may be configured such that the connection with the diode may be switched on and off with a switch. The photosensor 10 may be configured such that the connection with a positive or negative diode can be switched with a switch. The photosensor 10 may be electrically connected to a power supply for applying a bias voltage to the photosensor 10. The power supply is, for example, electrically connected to each of the first electrode 1 and the second electrode 3 of the photosensor 10.

Figure 3A:
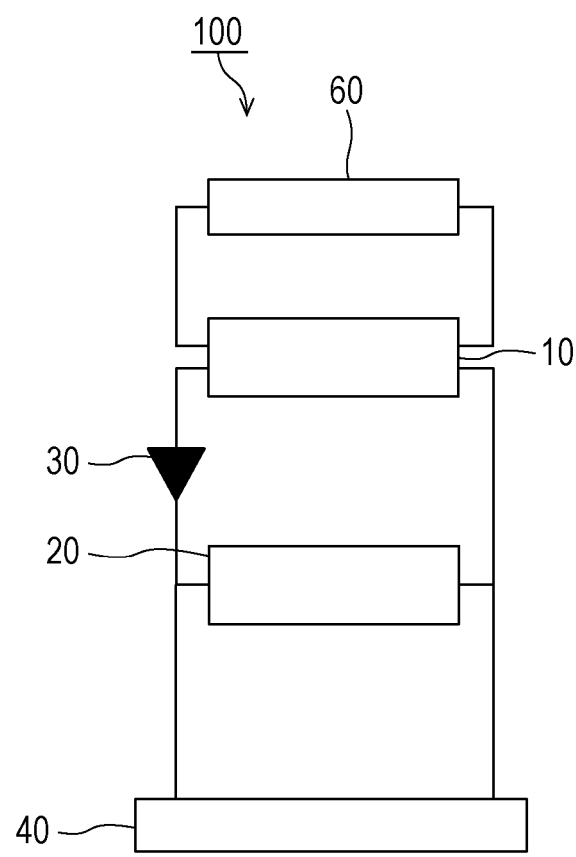
FIG. 3A is a circuit diagram of one example of an optical detection device according to the present disclosure.

FIG. 3A is a circuit diagram of a first example of the optical detection device according to the present disclosure. An optical detection device 100 includes a photosensor 10, a charge accumulator 20, a diode 30, a current/voltage meter 40, and a power supply 60. In the optical detection device 100, the components are electrically connected to one another. The diode 30 is disposed between the photosensor 10 and the charge accumulator 20. The current/voltage meter 40 functions as a detector.

The photosensor 10 generates current when irradiated with light. In the optical detection device 100, the on/off control of the diode 30 can be performed in accordance with the wavelength of irradiation light. When current flows into the charge accumulator 20, the current is amplified by the charge accumulator 20. The amplified current is detected by the current/voltage meter 40.

The power supply 60 may apply a bias voltage to the photosensor 10. As described above, the wavelength band of detectable light can be freely set by controlling the magnitude of the bias voltage applied to the photosensor 10. Even when a bias voltage is applied to the photosensor 10, the diode 30 causes the current generated in the photosensor 10 to flow in one direction.

The components of the optical detection device 100 will be described below in detail.

Charge Accumulator 20

The charge accumulator 20 is electrically connected to the photosensor 10. The charge accumulator 20 can store positive charges and negative charges. For example, when the electromotive force generated from the photosensor 10 is very small, the current generated in the photosensor 10 is stored in the charge accumulator 20 for a certain period of time and then outputted. This can amplify the current. The charge accumulator 20 is disposed between the photosensor 10 and the current/voltage meter 40. When there is a need to hold positive charges and negative charges in the optical detection device 100 of the present disclosure, the charge accumulator 20 may be a capacitor having a withstand voltage region in which the positive and negative drive voltage range resides. The charge accumulator 20 may be a capacitor having a withstand voltage in a positive-negative symmetrical form.

Diode 30

The diode 30 is electrically connected to the photosensor 10. The diode 30 may be a diode that has a function of conducting current only in one direction at an electromotive force (typically −1.5 to 1.5 V) generated from the photosensor 10. The diode 30 is not limited and may usually be, for example, a commercially available product. The diode 30 may have a function of being switched on and off by external control with, for example, a switching element.

Current/Voltage Meter 40

The current/voltage meter 40 is electrically connected to the photosensor 10. The current/voltage meter 40 can detect the current generated from the photosensor 10. The optical detection device 100 can thus detect light. The current/voltage meter 40 may be a commercially available product.

Power Supply 60

Figure 4:
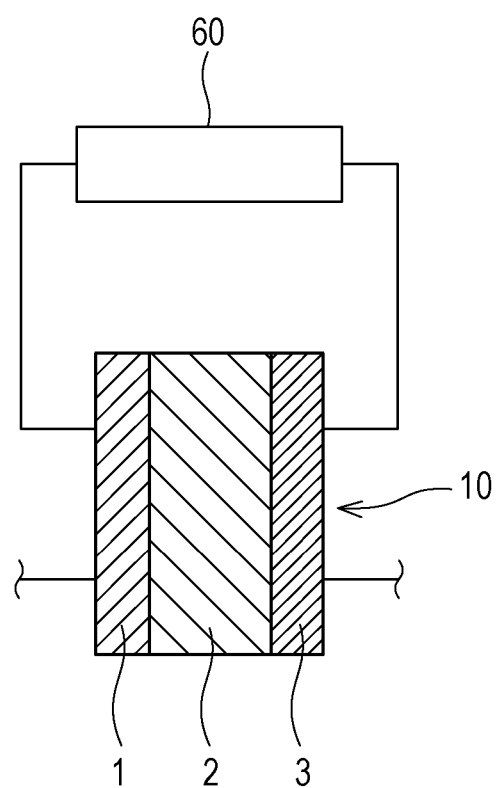
FIG. 4 is a view of the optical detection device depicted in FIGS. 3A to 3C where the power supply is electrically connected to each of the first electrode and the second electrode.

The power supply 60 is electrically connected to the photosensor 10. As depicted in FIG. 4, the power supply 60 may be electrically connected to each of the first electrode 1 and the second electrode 3 of the photosensor 10. The power supply 60 can apply a bias voltage to the photosensor 10. The power supply 60 includes, for example, a power source, a variable voltage circuit, and a switch. The power source is, for example, an AC-DC converter, a power-generating device, or a battery. The variable voltage circuit controls the magnitude of the bias voltage applied to the photosensor 10. The variable voltage circuit includes, for example, a boost converter or a buck converter. The switch is used to switch whether the power source and the photosensor 10 are electrically connected to each other or not. The switch is not limited and may be a commercially available product. The switch is, for example, a semiconductor switch. Examples of the semiconductor switch used as a switch include a FET.

Figure 3B:
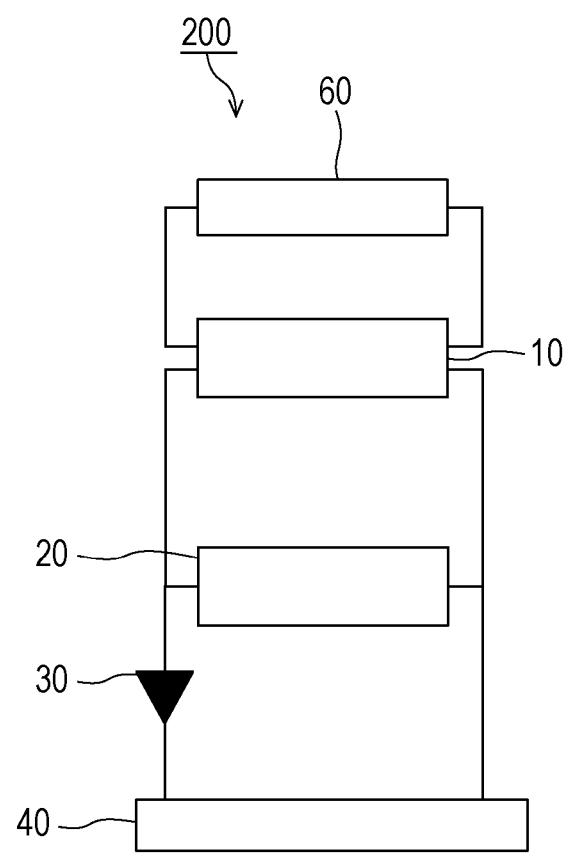
FIG. 3B is a circuit diagram of another example of the optical detection device according to the present disclosure.

FIG. 3B is a circuit diagram of a second example of the optical detection device according to the present disclosure. In an optical detection device 200, a diode 30 is disposed between a charge accumulator 20 and a current/voltage meter 40. The components having the same function and configuration as those in the optical detection device 100 are provided with the same reference numbers as those in the optical detection device 100, and the description thereof will be appropriately omitted.

The photosensor 10 generates current when irradiated with light. The current is amplified as the current flows into the charge accumulator 20. In the optical detection device 200, the on/off control of the diode 30 can be performed in accordance with the wavelength of detected light. In the case where the amplified current flows into the current/voltage meter 40, the current/voltage meter 40 detects the current.

Figure 3C:
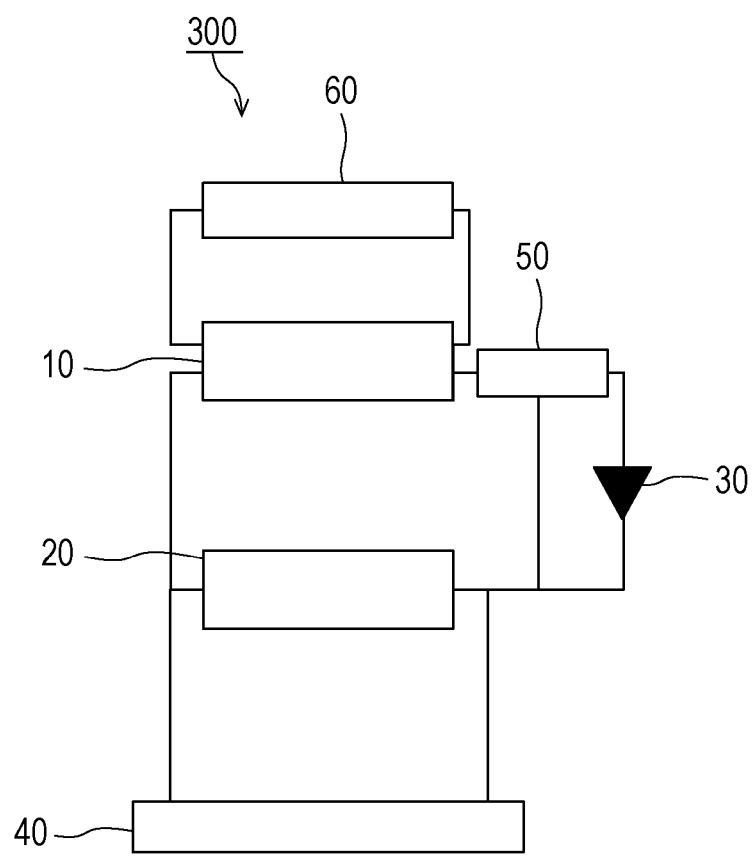
FIG. 3C is a circuit diagram of still another example of the optical detection device according to the present disclosure.

FIG. 3C is a circuit diagram of a third example of the optical detection device according to the present disclosure. In an optical detection device 300, a diode 30 is disposed between a photosensor 10 and a charge accumulator 20. A switch 50 is disposed between the diode 30 and the photosensor 10. The components having the same function and configuration as those in the optical detection device 100 are provided with the same reference numbers as those in the optical detection device 100, and the description thereof will be appropriately omitted.

The switch 50 is used to switch whether the photosensor 10 and the diode 30 are electrically connected to each other or not. When the photosensor 10 and the diode 30 are not electrically connected to each other in the optical detection device 300, the photosensor 10 and the charge accumulator 20 are electrically directly connected to each other. When the photosensor 10 and the diode 30 are electrically connected to each other, the on/off control of the diode 30 can be performed in accordance with the wavelength of detected light in the optical detection device 300. When the photosensor 10 and the diode 30 are not electrically connected to each other, the current flows into the charge accumulator 20 regardless of the direction in which the current flows. The current is amplified by the charge accumulator 20. The amplified current is detected by the current/voltage meter 40. The optical detection device 300 can determine which wavelength of light has high incident intensity, the wavelength of light that generates current flowing in one direction, or the wavelength of light that generates current flowing in the other direction.

Switch 50

The switch 50 is not limited and may be a commercially available product. The switch 50 is, for example, a semiconductor switch. Examples of the semiconductor switch used as the switch 50 include a FET.

EXAMPLES

The present disclosure will be specifically described below by way of Examples. The present disclosure is not limited by Examples described below.

Example 1

A photosensor was produced by using the following method.

First, as a perovskite compound to be contained in a photoelectric conversion layer, a compound (FAPbI$_3$ crystal: FA$^+$=CH(NH$_2$)$_2^+$) having two PL peaks was produced by using the following method.

First, PbI$_2$ (available from Tokyo Chemical Industry Co., Ltd.) and FAI (available from Tokyo Chemical Industry Co., Ltd.) were added to γ-butyllactone (γ-BL) and subjected to dissolution in an oil bath heated at 80° C. to produce a yellow solution (first solution). The concentration of PbI$_2$ in the first solution was 1 mol/L. The concentration of FAI in the first solution was 1 mol/L. Next, the first solution was once cooled to room temperature, and 0.7 vol % (volume ratio) of pure water was then added under adequate stirring. The resulting liquid (second solution) was stored at room temperature for a predetermined period (storage time Ts).

The second solution was then placed in a test tube and left to stand in the heated oil bath. The initial temperature of the second solution was set to 80° C., and the temperature of the second solution was increased from 80° C. to 110° C. over 1 hour, whereby crystal deposition slowly took place. As a result, a black crystal was deposited in the liquid. The crystal was then washed well with acetone to prepare a compound (FAPbI$_3$ crystal).

Figure 5:
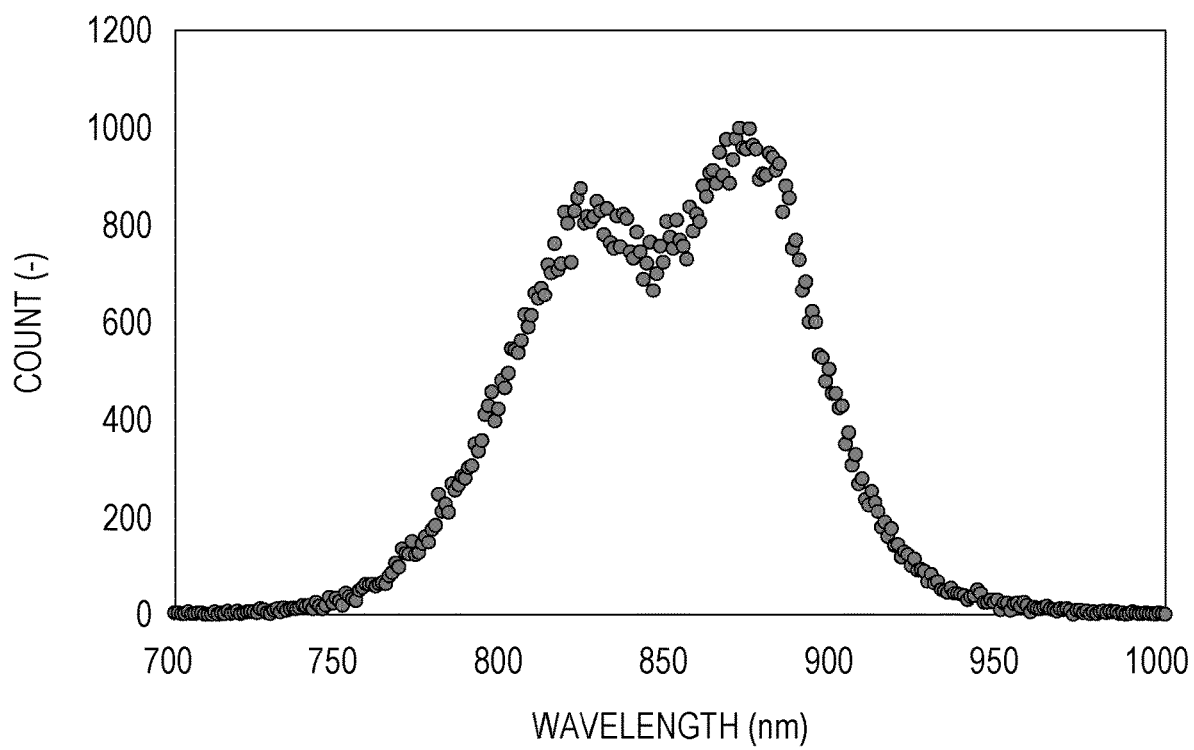
FIG. 5 is a graph of the fluorescence spectrum of a perovskite compound contained in a photoelectric conversion layer of a photosensor of Example 1.

The measurement of the fluorescence spectrum of the obtained compound revealed that the compound has two peaks at 830 nm and 880 nm. The obtained fluorescence spectrum is depicted in FIG. 5.

Next, the compound was cut into a plate shape with a diamond cutter, and the surface of the plate-shaped compound was smoothed with sand paper to prepare a plate-shaped sample (7 mm×7 mm) having a thickness of 200 µm.

Next, a substrate having an ITO film on the surface was provided as a first electrode 1. Next, the plate-shaped sample was disposed on the ITO film as a photoelectric conversion layer 2. Subsequently, gold was vapor-deposited on the surface of the sample to form a second electrode 3. A photosensor of Example 1 was produced accordingly. The size (area) of the element was 7 mm×7 mm. The components of the photosensor of Example 1 are as described below.

Substrate: Glass substrate (7 mm×7 mm, 0.7 mm thick)
First electrode 1: ITO (surface resistance: 10Ω/□)
Photoelectric conversion layer 2: FAPbI$_3$ (200 µm thick)
Second electrode 3: Au (80 nm thick)

The work function of ITO, the first electrode 1, is 4.7 eV, and the work function of Au, the second electrode 3, is 4.7 eV.

Example 2

A photosensor of Example 2 was produced by using the same method as in Example 1 except that PEDOT/PSS (available from Aldrich) with a thickness of 100 nm was further deposited on the ITO layer used in Example 1. In the photosensor of Example 2, PEDOT/PSS functioned as the first electrode 1. The work function of PEDOT/PSS, the first electrode 1, is 5.1 eV, and the work function of Au, the second electrode 3, is 4.7 eV.

Example 3

A photosensor of Example 3 was produced by using the same method as in Example 1 except that SnO$_2$ with a thickness of 20 nm was further deposited by sputtering on the ITO layer used in Example 1. In the photosensor of Example 3, SnO$_2$ functioned as the first electrode 1. The work function of SnO$_2$, the first electrode 1, is 4.8 eV, and the work function of Au, the second electrode 3, is 4.7 eV.

Example 4

Figure 6:
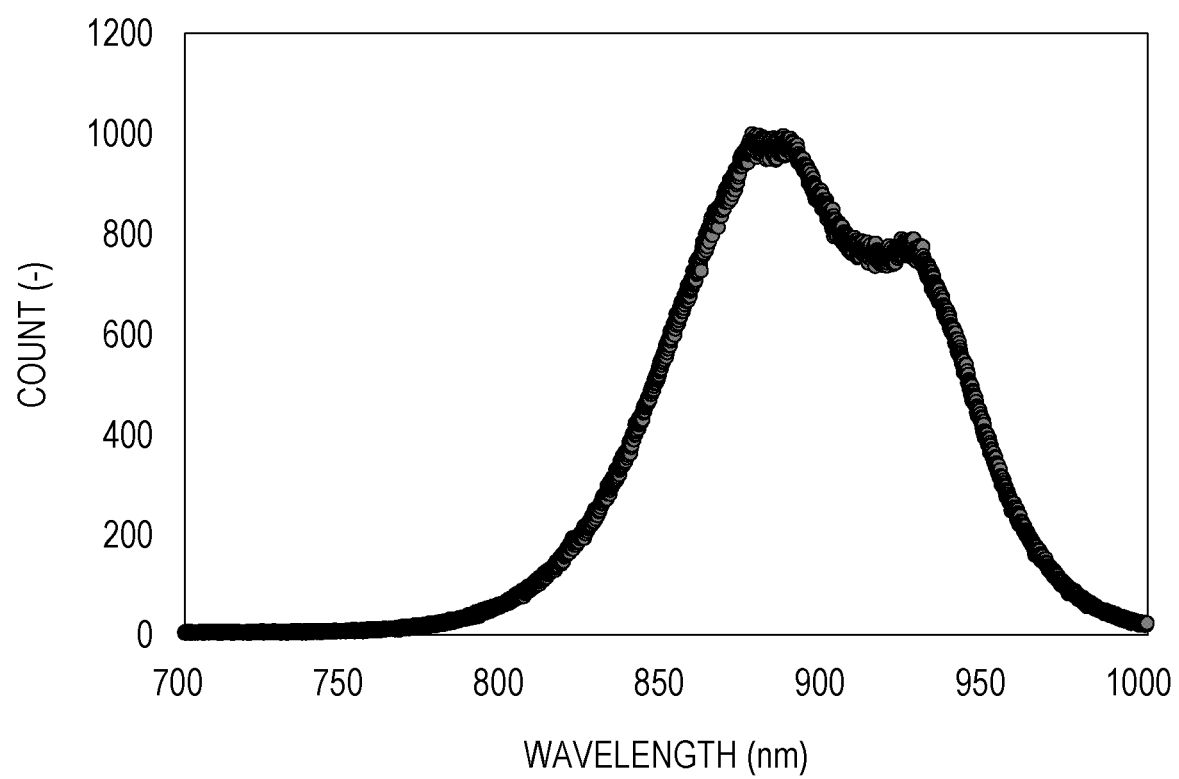
FIG. 6 is a graph of the fluorescence spectrum of a perovskite compound contained in a photoelectric conversion layer of a photosensor of Example 4.

A photosensor of Example 4 was produced by using the same method as in Example 1 except that, instead of PbI$_2$, SnI$_2$ was added to γ-BL and all manipulations were performed in a N$_2$ atmosphere. The fluorescence spectrum of a compound (FASnI$_3$ crystal) contained in the photoelectric conversion layer of the photosensor of Example 4 is depicted in FIG. 6. As is apparent from FIG. 6, the fluorescence spectrum of the compound had two peaks at 870 nm and 920 nm.

Comparative Example 1

Figure 7:
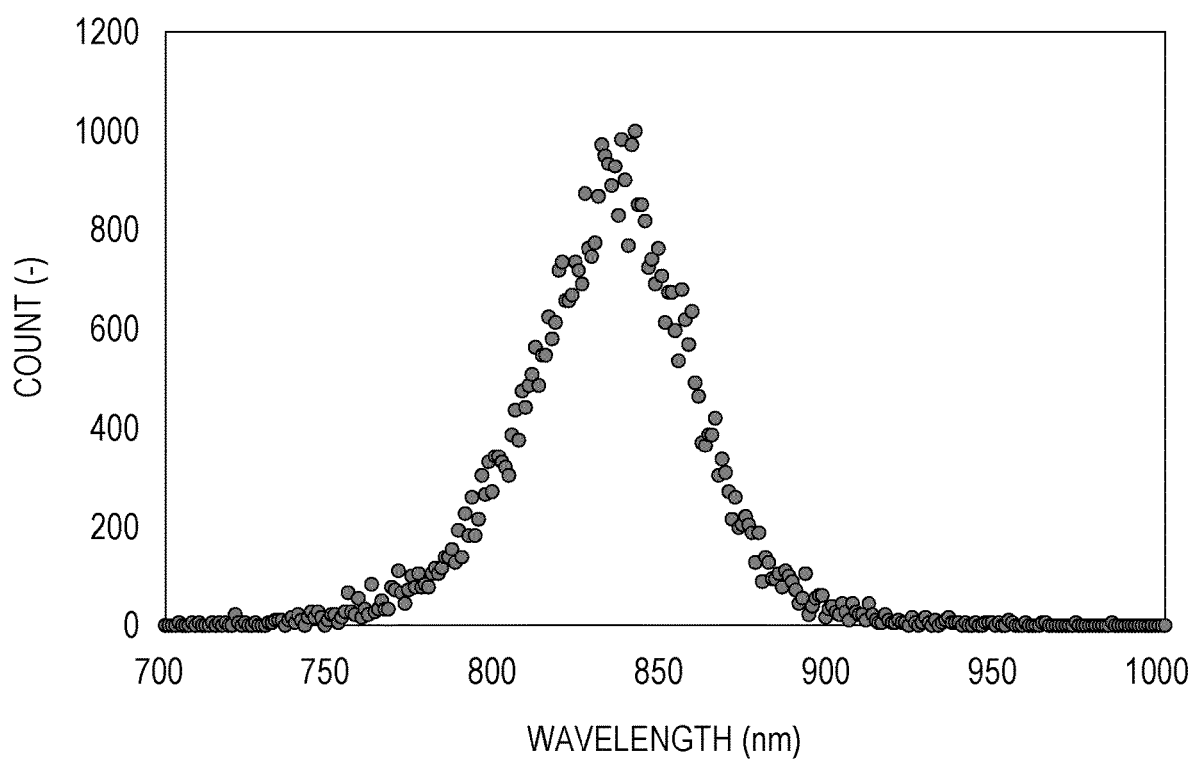
FIG. 7 is a graph of the fluorescence spectrum of a perovskite compound contained in a photoelectric conversion layer of a photosensor of Comparative Example 1.

A photosensor of Comparative Example 1 was produced by using the same method as in Example 1 except that a dimethyl sulfoxide (DMSO) solution containing 1 mol/L of $PbI_2$ and 1 mol/L of FAI was applied to a ITO layer, which was the first electrode, by spin coating to form a photoelectric conversion layer. The fluorescence spectrum of a compound ($FAPbI_3$ crystal) contained in the photoelectric conversion layer of the photosensor of Comparative Example 1 is depicted in FIG. 7. As is apparent from FIG. 7, the fluorescence spectrum of the compound had only one peak (830 nm).

Comparative Example 2

A photosensor of Comparative Example 2 was produced by using the same method as in Example 1 except that $TiO_2$ with a thickness of 20 nm was further deposited by sputtering on the ITO layer used in Example 1. In the photosensor of Comparative Example 2, $TiO_2$ functioned as the first electrode 1. The work function of $TiO_2$, the first electrode 1, is 4.2 eV, and the work function of Au, the second electrode 3, is 4.7 eV.

Comparative Example 3

Figure 8:
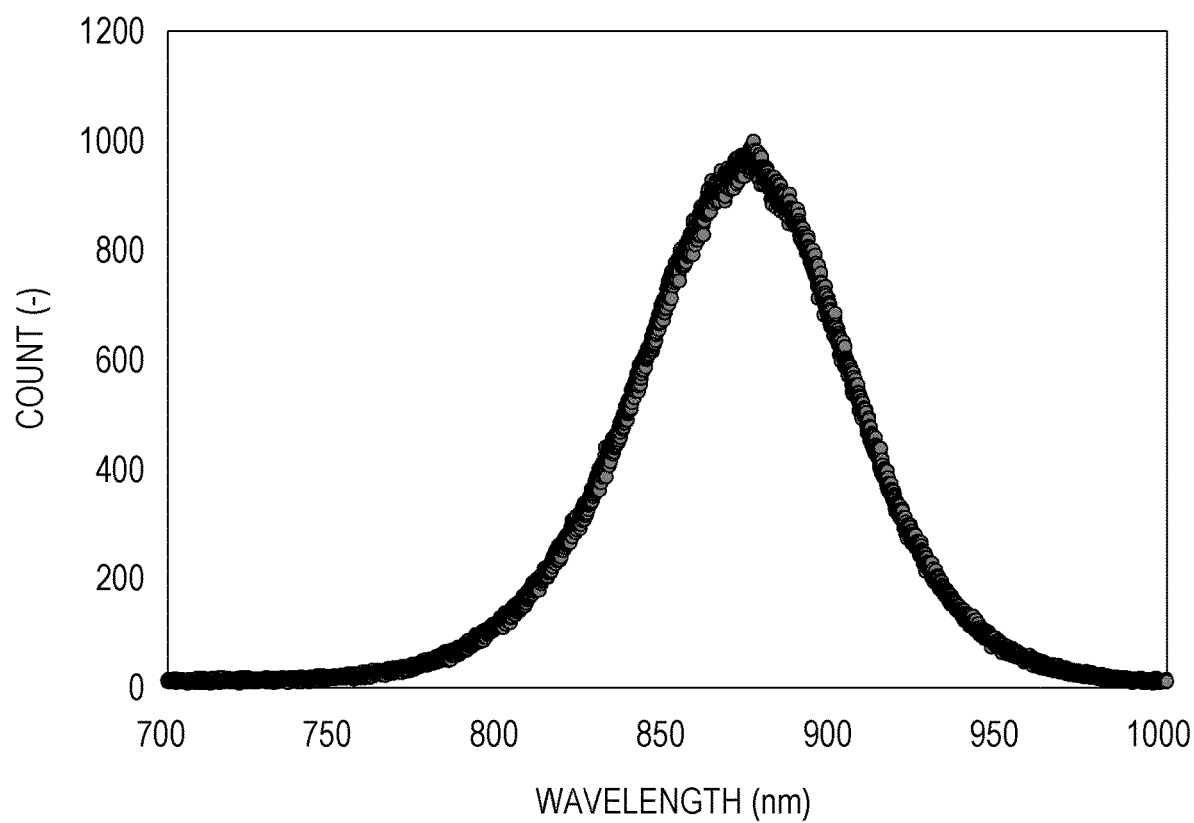
FIG. 8 is a graph of the fluorescence spectrum of a perovskite compound contained in a photoelectric conversion layer of a photosensor of Comparative Example 3.
Figure 9:
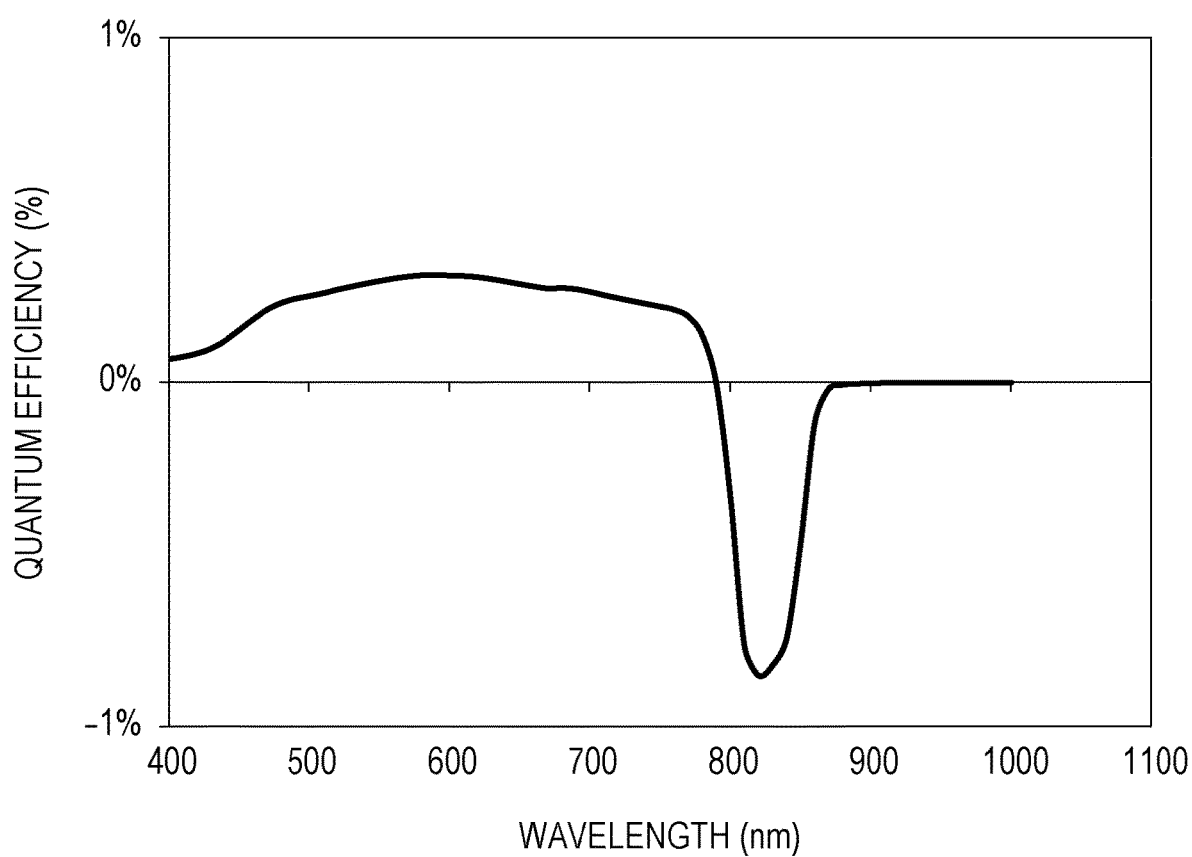
FIG. 9 is a graph of the quantum efficiency of the photosensor of Example 1 as a function of wavelength.
Figure 10:
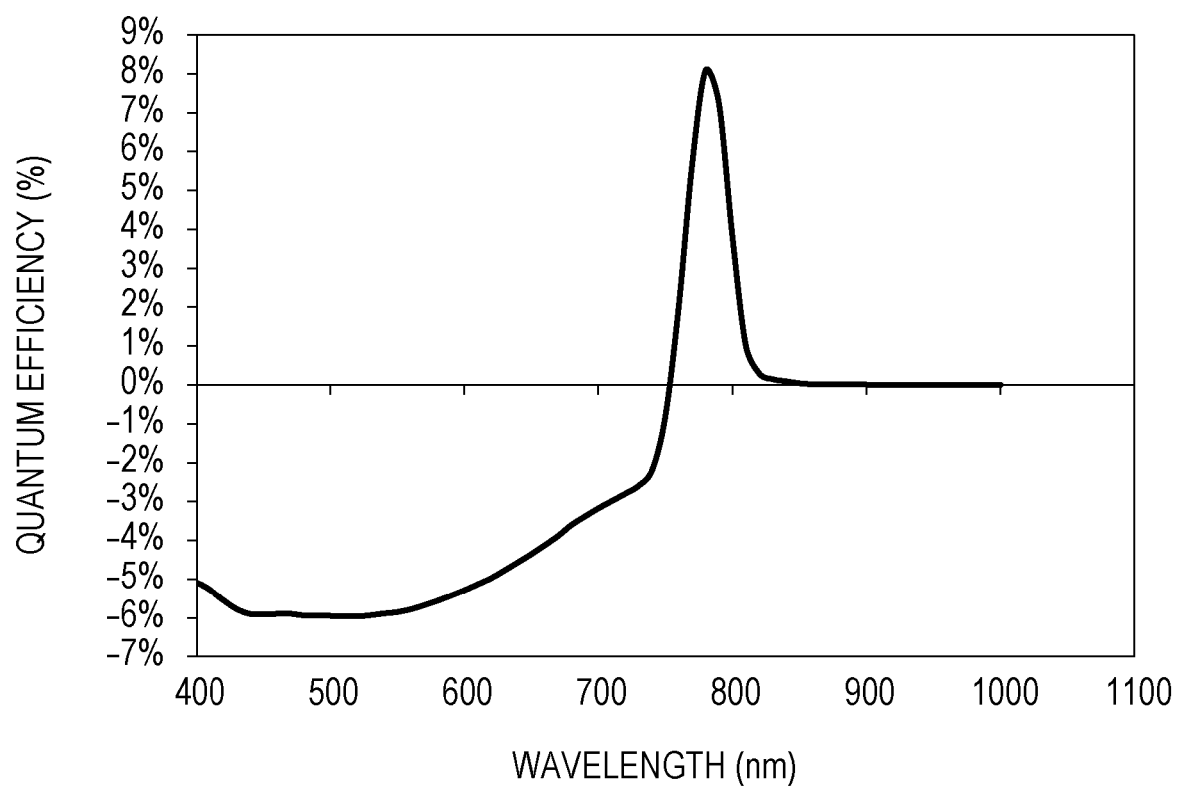
FIG. 10 is a graph of the quantum efficiency of a photosensor of Example 2 as a function of wavelength.
Figure 11:
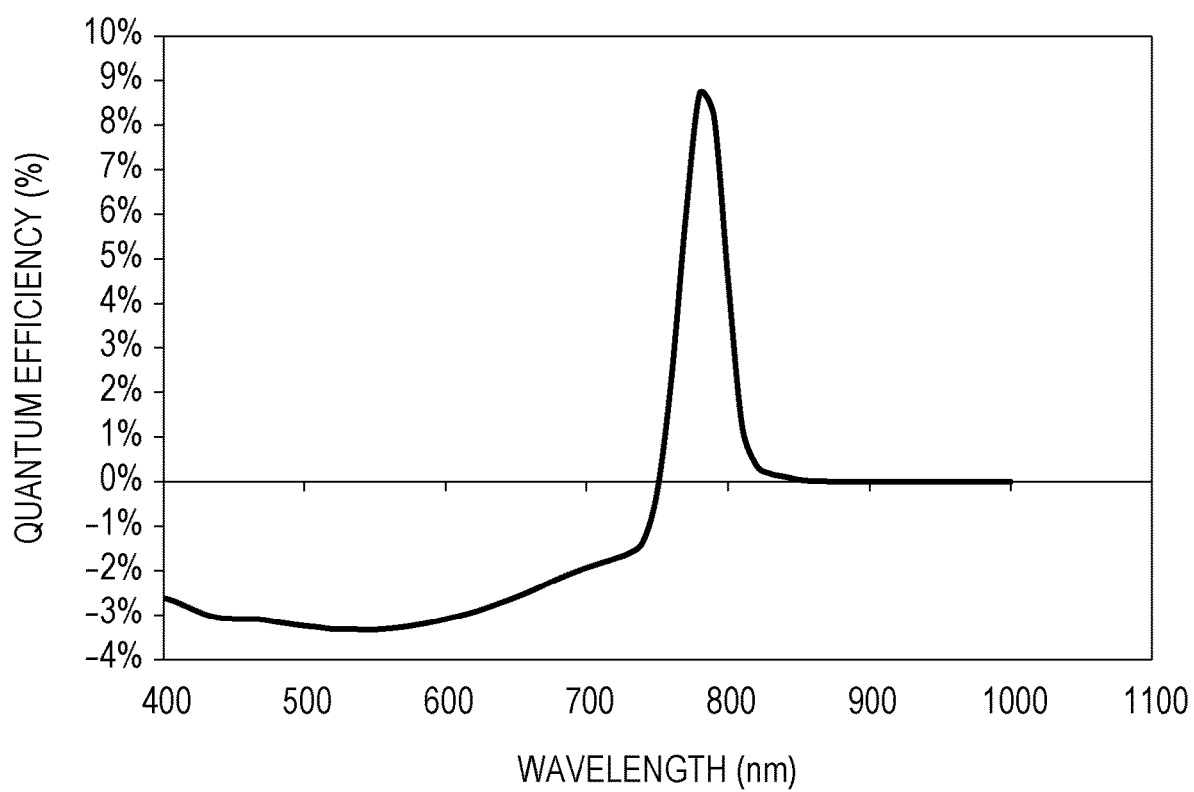
FIG. 11 is a graph of the quantum efficiency of a photosensor of Example 3 as a function of wavelength.
Figure 12:
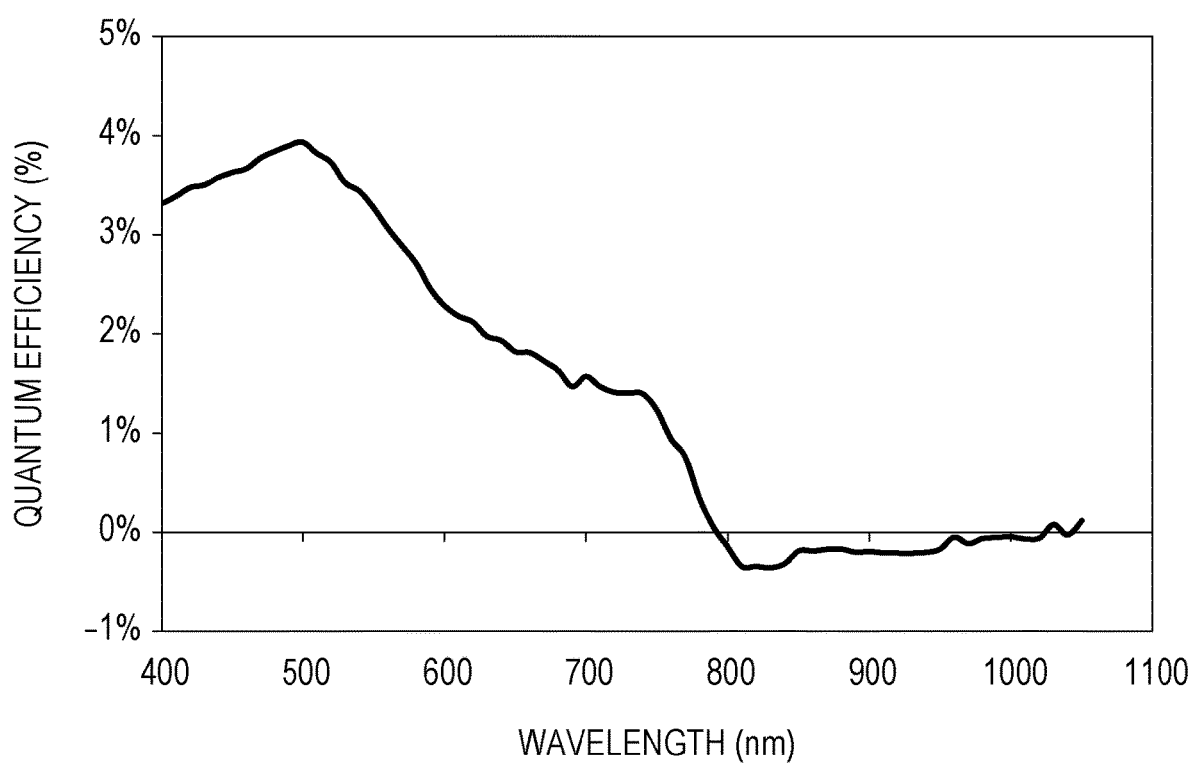
FIG. 12 is a graph of the quantum efficiency of the photosensor of Example 4 as a function of wavelength.
Figure 13:
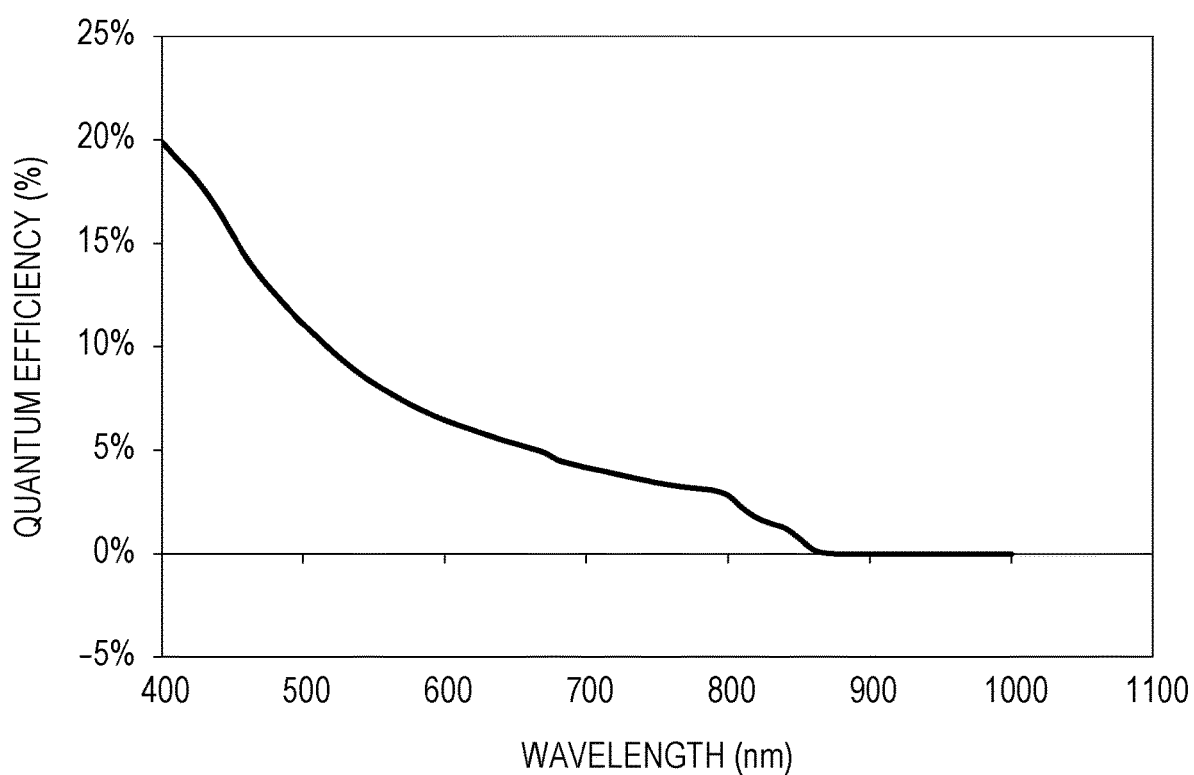
FIG. 13 is a graph of the quantum efficiency of the photosensor of Comparative Example 1 as a function of wavelength.
Figure 14:
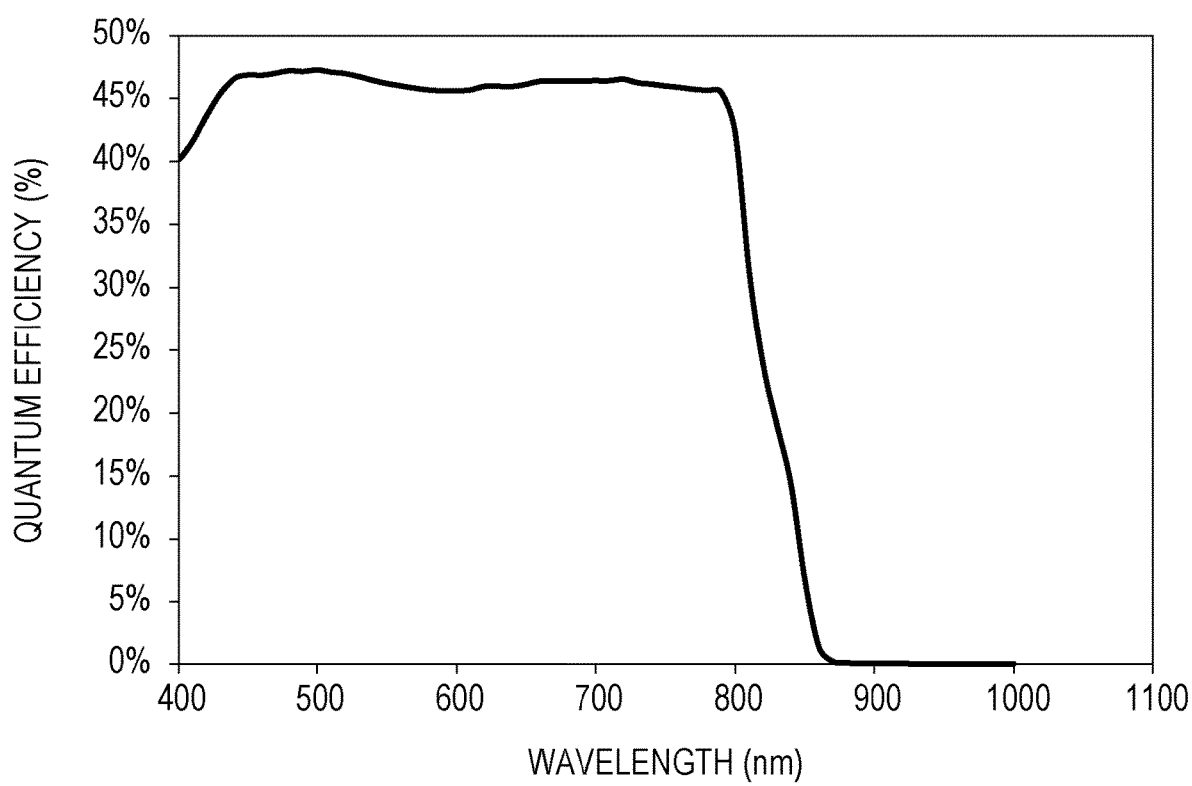
FIG. 14 is a graph of the quantum efficiency of a photosensor of Comparative Example 2 as a function of wavelength.
Figure 15:
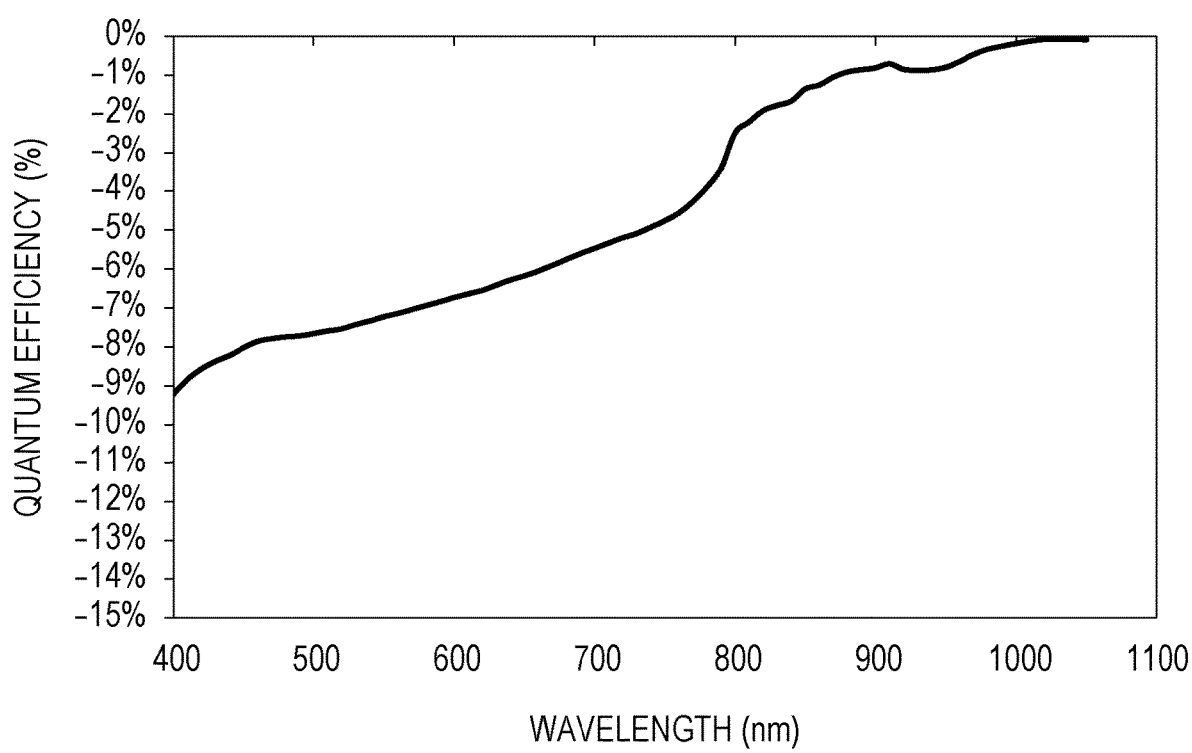
FIG. 15 is a graph of the quantum efficiency of the photosensor of Comparative Example 3 as a function of wavelength.
Figure 16:
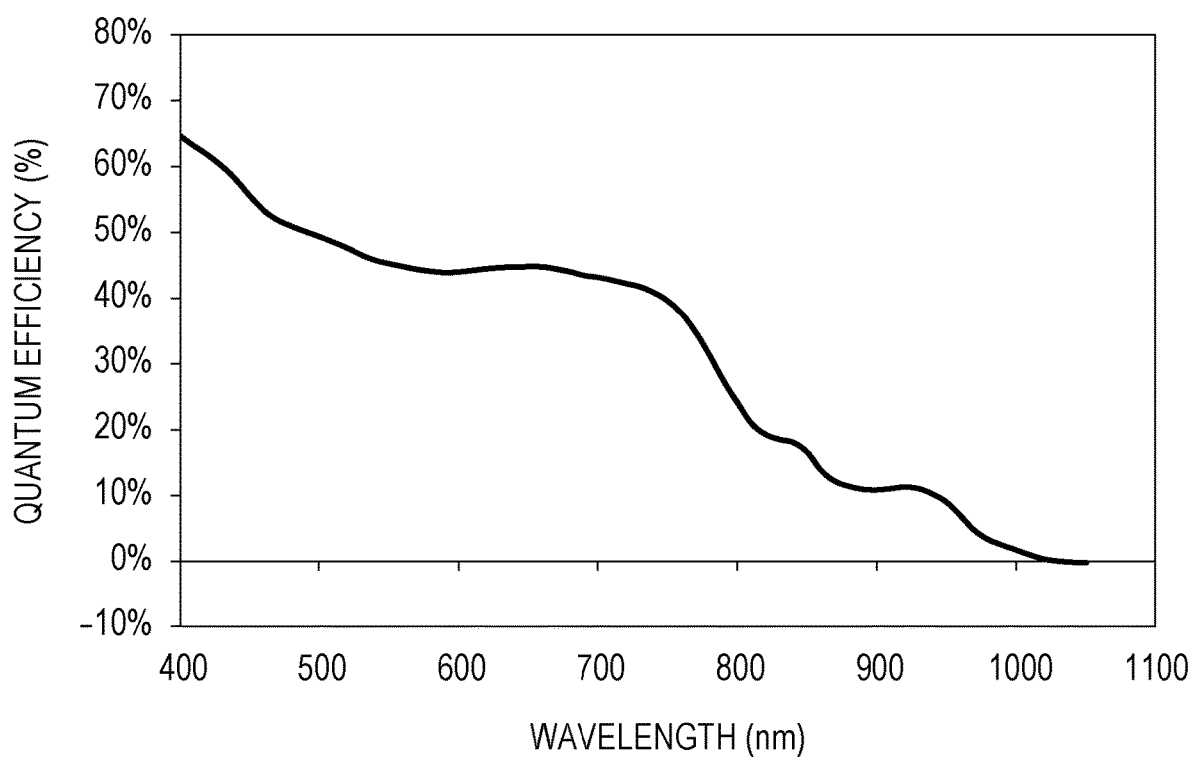
FIG. 16 is a graph of the quantum efficiency of the photosensor of Comparative Example 4 as a function of wavelength.

A photosensor of Comparative Example 3 was produced by using the same method as in Comparative Example 1 except that a DMSO solution containing $SnI_2$ instead of $PbI_2$ was used and all manipulations were performed in a $N_2$ atmosphere. The fluorescence spectrum of a compound ($FASnI_3$ crystal) contained in the photoelectric conversion layer of the photosensor of Comparative Example 3 is depicted in FIG. 8. As is apparent from FIG. 8, the fluorescence spectrum of the compound had only one peak (880 nm).

Comparative Example 4

A photosensor of Comparative Example 4 was produced by using the same method as in Example 4 except that $TiO_2$ with a thickness of 20 nm was further deposited by sputtering on the ITO layer used in Comparative Example 4. In the photosensor of Comparative Example 4, $TiO_2$ functioned as the first electrode 1. The work function of $TiO_2$, the first electrode 1, is 4.2 eV, and the work function of Au, the second electrode 3, is 4.7 eV.

Evaluation of Characteristics

For the photosensors of Examples 1 to 4 and Comparative Examples 1 to 4, the quantum efficiency as a function of wavelength was measured as a sensor characteristic. The results are shown in FIGS. 9 to 16 and Table 1. The positive or negative of the quantum efficiency indicates the direction in which the current flows in the corresponding wavelength band.

TABLE 1

| | Photoelectric conversion layer | | | Electrode | | | Current direction change | |
|---|---|---|---|---|---|---|---|---|
| | | | | | Electrode material | | Present | |
| | Compound | Number of PL peaks | Peak wavelength (nm) | Ohmic contact | First electrode | Second electrode | or absent | Wavelength (nm) |
| Example 1 | $FAPbI_3$ | 2 | 830, 880 | A | ITO | Au | present | 790 |
| Example 2 | $FAPbI_3$ | 2 | 830, 880 | A | PEDOT/PSS | Au | present | 760 |
| Example 3 | $FAPbI_3$ | 2 | 830, 880 | A | $SnO_2$ | Au | present | 750 |
| Example 4 | $FASnI_3$ | 2 | 870, 920 | A | ITO | Au | present | 800 |
| Comparative Example 1 | $FAPbI_3$ | 1 | 830 | A | ITO | Au | absent | — |
| Comparative Example 2 | $FAPbI_3$ | 2 | 830, 880 | B | $TiO_2$ | Au | absent | — |
| Comparative Example 3 | $FASnI_3$ | 1 | 880 | A | ITO | Au | absent | — |
| Comparative Example 4 | $FASnI_3$ | 2 | 870, 920 | B | $TiO_2$ | Au | absent | — |

In the column of the ohmic contact in Table 1, A indicates that the first electrode 1 and the second electrode 3 each are in ohmic contact with the photoelectric conversion layer. B indicates that at least one of the first electrode 1 and the second electrode 3 is not in ohmic contact with the photoelectric conversion layer. As is apparent from FIGS. 9 to 16 and Table 1, in the case of using the photoelectric conversion layer containing the compound having two or more PL peaks and disposing the electrode that comes in ohmic contact with the photoelectric conversion layer, the direction of current flow is reversed in response to a change in the wavelength of irradiation light. For example, the quantum efficiency at wavelengths shorter than 790 nm is a positive value in the photosensor of Example 1. The quantum efficiency at wavelengths of 790 nm or longer is a negative value. In other words, the direction of the current generated from the photosensor is reversed at a wavelength of 790 nm in the photosensor of Example 1. In other words, the photosensor of Example 1 has a changeover wavelength of 790 nm. Similarly, the direction of the current generated from the photosensor is reversed at a wavelength of 760 nm in the photosensor of Example 2. In other words, the photosensor of Example 2 has a changeover wavelength of 760 nm. In the photosensor of Example 3, the direction of the current generated from the photosensor is reversed at a wavelength of 750 nm. In other words, the photosensor of Example 3 has a changeover wavelength of 750 nm. In the photosensor of Example 4, the direction of the current generated from the photosensor is reversed at a wavelength of 800 nm. In other words, the photosensor of Example 4 has a changeover wavelength of 800 nm. In the photosensors of Comparative Examples 1 to 4, the quantum efficiency is either a positive value or a negative value in any wavelength band, and the direction of the current is not reversed even when the wavelength of irradiation light is changed. According to the photosensor of the present disclosure, one element can distinguish and detect light in plural wavelength bands.

Figure 17:
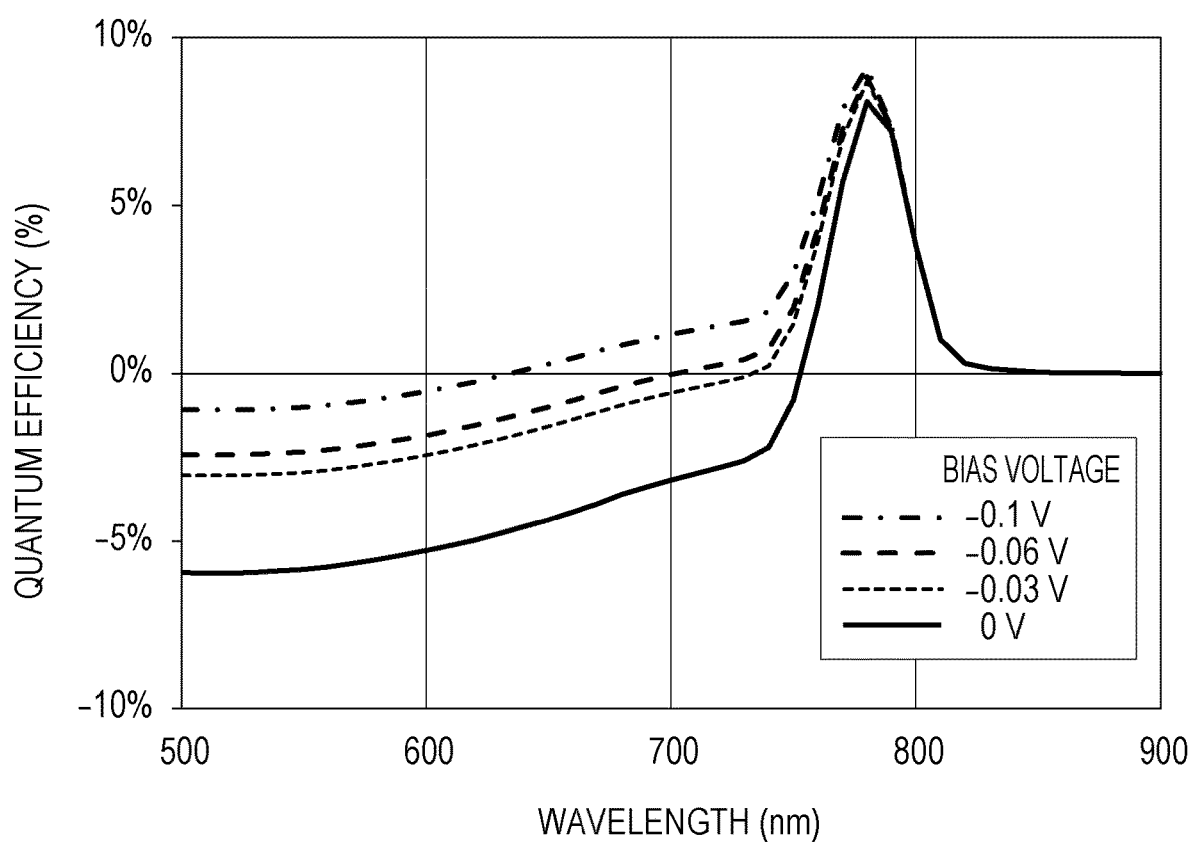
FIG. 17 is a graph of the quantum efficiency of the photosensor of Example 2 as a function of wavelength when a bias voltage is applied to the photosensor of Example 2.

Next, a bias voltage was applied to the photosensor of Example 2. The bias voltage was −0.03 V. At this time, the quantum efficiency of the photosensor was measured as a function of wavelength. The results are shown in FIG. 17. As is apparent from FIG. 17, the changeover wavelength of the photosensor shifts to the shorter wavelength side upon application of a bias voltage of −0.03 V. Specifically, the changeover wavelength of the photosensor was 730 nm.

Next, the bias voltage applied to the photosensor of Example 2 was changed to −0.06 V, and the quantum efficiency of the photosensor was measured as a function of wavelength. The results are shown in FIG. 17. The changeover wavelength of the photosensor in this case was 700 nm. Similarly, the bias voltage applied to the photosensor of Example 2 was changed to −0.1 V, and the quantum efficiency of the photosensor was measured as a function of wavelength. The results are shown in FIG. 17. The changeover wavelength of the photosensor in this case was 640 nm. According to the photosensor of the present disclosure, light in a given wavelength band can be detected by controlling the magnitude of the bias voltage applied to the photosensor.

What is claimed is:

1. A photosensor comprising:
a first electrode;
a second electrode that opposes the first electrode; and
a photoelectric conversion layer that is disposed between the first electrode and the second electrode and converts incident light into electric charges, wherein:
at least one electrode selected from the group consisting of the first electrode and the second electrode is light-transmissive,
the photoelectric conversion layer contains a perovskite compound,
a fluorescence spectrum of the perovskite compound has a first peak and a second peak,
the perovskite compound has a first band gap corresponding to the first peak and a second band gap corresponding to the second peak, and
the photoelectric conversion layer is in ohmic contact with each of the first electrode and the second electrode.

2. The photosensor according to claim 1, wherein:
a difference between a value of a work function of the first electrode and a value of a work function of the second electrode is 0.5 eV or less.

3. The photosensor according to claim 1, wherein:
a value of a work function of the first electrode or the second electrode is located between a conduction band bottom of the first band gap and a conduction band bottom of the second band gap or between a valence band top of the first band gap and a valence band top of the second band gap.

4. The photosensor according to claim 1, wherein:
the second peak is located between a wavelength of the first peak and a wavelength having an lower energy than the wavelength of the first peak by 0.05 eV.

5. The photosensor according to claim 1, wherein:
the first peak is located in a wavelength range of 800 nm or more and 840 nm or less and the second peak is located in a wavelength range of 850 nm or more and 910 nm or less.

6. An optical detection device comprising:
a photosensor; and
a detector electrically connected to the photosensor, wherein:
the photosensor includes:
a first electrode;
a second electrode that opposes the first electrode; and
a photoelectric conversion layer that is disposed between the first electrode and the second electrode and converts incident light into electric charges,
at least one electrode selected from the group consisting of the first electrode and the second electrode is light-transmissive,
the photoelectric conversion layer contains a perovskite compound,
a fluorescence spectrum of the perovskite compound has a first peak and a second peak,
the perovskite compound has a first band gap corresponding to the first peak and a second band gap corresponding to the second peak, and
the photoelectric conversion layer is in ohmic contact with each of the first electrode and the second electrode.

7. The optical detection device according to claim 6, further comprising:
a diode electrically connected to the photosensor.

8. The optical detection device according to claim 6, wherein:
the charge accumulator is configured to accumulate positive charges and negative charges.

9. The optical detection device according to claim 6, further comprising:
a charge accumulator electrically connected to the photosensor.

10. The optical detection device according to claim 6, further comprising:
a power supply electrically connected to the photosensor.

11. The optical detection device according to claim 6, wherein:
the second peak is located between a wavelength of the first peak and a wavelength having an lower energy than the wavelength of the first peak by 0.05 eV.

12. The optical detection device according to claim 6, wherein:
the first peak is located in a wavelength range of 800 nm or more and 840 nm or less and the second peak is located in a wavelength range of 850 nm or more and 910 nm or less.

13. A light-absorbing material comprising:
a perovskite compound represented by composition formula $AMX_3$, where A is a monovalent cation, M is a divalent cation, and X is a monovalent anion, wherein:
the M includes $Sn^{2+}$, and
a fluorescence spectrum of the light-absorbing material has a first peak and a second peak, and
the perovskite compound has a first band gap corresponding to the first peak and a second band gap corresponding to the second peak.

14. The light-absorbing material according to claim 13, wherein:
the A includes a formamidinium cation.

\* \* \* \* \*